United States Patent
Tran et al.

(10) Patent No.: US 6,784,690 B2
(45) Date of Patent: Aug. 31, 2004

(54) CIRCUIT AND METHOD FOR DYNAMICALLY CONTROLLING THE IMPEDANCE OF AN INPUT/OUTPUT DRIVER

(75) Inventors: Tri K. Tran, San Leandro, CA (US); Cong K. Khieu, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/234,657

(22) Filed: Sep. 4, 2002

(65) Prior Publication Data

US 2004/0041583 A1 Mar. 4, 2004

(Under 37 CFR 1.47)

(51) Int. Cl.$^7$ ................................................ H03K 17/16
(52) U.S. Cl. .................... 326/30; 326/86; 326/83; 326/63; 326/81; 327/108; 327/112
(58) Field of Search ................. 326/30, 81, 83, 326/86, 63, 68, 93, 95, 98; 327/108, 112, 333

(56) References Cited

U.S. PATENT DOCUMENTS

| | | | |
|---|---|---|---|
| 5,736,869 A | | 4/1998 | Wei |
| 5,773,999 A | | 6/1998 | Park et al. |
| 5,952,847 A | * | 9/1999 | Plants et al. .................. 326/80 |
| 5,955,894 A | | 9/1999 | Vishwanthaiah et al. |
| 5,999,978 A | | 12/1999 | Angal et al. |
| 6,031,394 A | | 2/2000 | Cranford, Jr. et al. |
| 6,060,907 A | | 5/2000 | Vishwanthaiah et al. |
| 6,064,656 A | | 5/2000 | Angal et al. |
| 6,085,033 A | | 7/2000 | Starr et al. |
| 6,212,511 B1 | | 4/2001 | Fisher et al. |
| 6,218,863 B1 | | 4/2001 | Hsu et al. |
| 6,278,306 B1 | | 8/2001 | Ang et al. |
| 6,281,729 B1 | | 8/2001 | Ang et al. |
| 6,294,924 B1 | | 9/2001 | Ang et al. |
| 6,297,677 B1 | | 10/2001 | Ang et al. |
| 6,316,957 B1 | | 11/2001 | Ang et al. |
| 6,336,139 B1 | | 1/2002 | Feridun et al. |
| 6,339,351 B1 | | 1/2002 | Ang et al. |
| 6,353,346 B1 | | 3/2002 | Chan |
| 6,366,149 B1 | | 4/2002 | Lee et al. |
| 6,369,613 B1 | * | 4/2002 | Costello et al. ............... 326/83 |
| 6,414,524 B1 | | 7/2002 | Chen |
| 6,420,913 B1 | | 7/2002 | Ang et al. |
| 6,441,653 B1 | | 8/2002 | Spurlin |
| 6,459,325 B1 | * | 10/2002 | Hall et al. ................... 327/391 |
| 6,466,063 B2 | | 10/2002 | Chen |
| 6,489,807 B2 | | 12/2002 | Genna et al. |
| 6,496,044 B1 | * | 12/2002 | Nguyen et al. ............. 327/108 |
| 6,600,348 B1 | | 7/2003 | Yu et al. |
| 6,608,506 B2 | | 8/2003 | Ang et al. |
| 2003/0222682 A1 | | 12/2003 | Yu et al. |
| 2003/0222683 A1 | | 12/2003 | Yu et al. |
| 2003/0225943 A1 | | 12/2003 | Yu et al. |

* cited by examiner

Primary Examiner—Vibol Tan
(74) Attorney, Agent, or Firm—Zagorin, O'Brien & Graham LLP

(57) ABSTRACT

Disclosed is an input/output (IO) device having a power supply node, an input node for receiving an input data signal, and an output node for outputting an output data signal generated in response to the input node receiving the input data bit signal. The IO device also includes a pull-up driver coupled to the power supply node and the output node, wherein the pull-up driver comprises an impedance at the output node which is constant for all voltages at the output node. Additionally, the IO device may have a circuit coupled to the input node, the pull-up driver, and the output node. This circuit is configured to generate a signal that is provided to the pull-up driver. The signal generated by the circuit varies as a function of the voltage at the output node.

15 Claims, 5 Drawing Sheets

CIRCUIT AND METHOD FOR DYNAMICALLY CONTROLLING THE IMPEDANCE OF AN INPUT/OUTPUT DRIVER

CROSS-REFERENCE TO RELATED APPLICATIONS

This application is related to:

U.S. patent application Ser. No. 10/158,819;
U.S. patent application Ser. No. 10/159,002;
U.S. patent application Ser. No. 10/159,684; and
U.S. patent application Ser. No. 10/159,881.

Each of these applications was filed May 30, 2002 and is incorporated herein by reference in its entirety.

BACKGROUND OF THE INVENTION

FIG. 1 illustrates in block diagram form a microprocessor 10 coupled to memory device 12 via data bus 14. Although not shown, data bus 14 includes a plurality of conductive lines, each one of which is capable of transmitting a data bit signal between memory device 12 and microprocessor 10. Microprocessor 10 includes a plurality of input/output (IO) devices (not shown in FIG. 1) coupled to respective conductive lines of data bus 14. IO devices generate the data bit signals which are subsequently transmitted over bus 14, or IO devices receive data bit signals generated by memory device 12 and transmitted via data bus 14.

IO devices include drivers for driving a conductive line of a bus in accordance with a data bit signal received by the IO device. FIG. 2A is a schematic diagram of a driver 16 which may be employed in one of the IO devices of microprocessor 10. IO driver 16 shown in FIG. 2A should not be considered prior art under 35 USC Section 102 to the invention described or claimed within this specification. In FIG. 2A, driver 16 includes a voltage level converter circuit 20, a pull-up circuit 22, and a pull-down circuit 24, all of which are coupled between input and output nodes 26 and 28. Operational aspects of voltage level converter circuit 20 are described in U.S. application Ser. No. 10/159,684.

Pull-up circuit 22 of FIG. 2A includes p-channel field effect transistors (FETs) 30 and 32 while pull-down circuit 24 includes N-channel FETs 40 and 42. FETs 32 and 42 are coupled to bias voltages $V_p$ and $V_n$, respectively. FETs 32 and 42 limit the gate to source ($V_{gs}$) and gate to drain ($V_{gd}$) of FETS 30 and 32, respectively, below $V_{limit}$ as is more fully described in U.S. application Ser. No. 10/159,684.

Driver 16 receives input data bit signal $D_{in}$ 16 directly or indirectly from the core of microprocessor 10. In response to receiving Driver 16 generates output data bit signal $D_{out}$ at output node 28 which, in turn, is directly or indirectly coupled to a conductive line of data bus 14. When driver 16 receives $D_{in}$, voltage level converter 20 generates signal $D_{mod}$ as is more fully described in U.S. application Ser. No. 10/159,684. The voltage magnitude of $D_{mod}$ varies between $V_{DD1}$, the voltage of a first power supply provided to driver 16, and an intermediate voltage $V_{int}$ depending on the magnitude of $D_{in}$. More particularly, voltage level converter circuit 20 generates $D_{mod}$ equal to $V_{int}$ when $D_{in}$ equals ground (logical 0), and voltage level converter circuit 20 generates $D_{mod}$ equal to $V_{DD1}$ when $D_{in}$ equals $V_{DD2}$ (logical 1), the magnitude of a second power supply provided to the core of microprocessor 10. $V_{DD1}$ is greater in magnitude that $V_{DD2}$. $V_{int}$ is between $V_{DD1}$ and ground in magnitude, and $V_{int}$ is at least a threshold voltage $V_t$ below $V_{DD1}$.

As noted, $D_{mod}$ is generated as a function of $D_{in}$. $D_{mod}$ is provided to the gate of FET 30. When $D_{mod}$ equals $V_{int}$, FET 30 switches on to create a conductive path between its source and drain. When switched on, current from the first power supply can pass through FET 30 and charge node 28 and the conductive line of bus 14 coupled thereto. Note that FET 32 is switched on and FET 40 is switched off when FET 30 is switched on. When $D_{mod}$ equals $V_{DD1}$, FET 30 is switched off and no current can flow therethrough. However, FET 40 is switched on to create a conductive path between its source and drain. When switched on, current from can pass through FET 40 to ground and discharge charge node 28 and the conductive line of bus 14 coupled thereto. Note that FET 42 is switched on when FET 40 is switched. Driver 16 thus generates $D_{out}$ by charging or discharging output node 28 as a function of input data signal $D_{in}$.

The signal frequency or rate at which output data bit signals $D_{out}$ transmit over data bus 14 can limit the performance of the system shown in FIG. 1. The higher the transmission frequency, the better. The maximum frequency is a function not only of the time that it takes the electromagnetic wave fronts of data bit signal $D_{out}$ to propagate on bus 14 between microprocessor 10 and memory device 12, but also the time required for data bit signal $D_{out}$ to settle to a voltage level that can be reliably recognized by the receiving IO device of memory 12 as being high (logical 1) or low (logical 0).

The time required for $D_{out}$ to settle is often referred to as the settling time. There are several factors which affect the settling time. For example, ringing due to reflections from impedance mismatches between the data bus 14 and drivers of IO devices connected thereto is a factor which affects the settling time of the signal.

FIG. 2B is current/voltage (IV) plot of pull-up circuit 22 of driver 16 at output node 28. This plot shows the impedance of the pull-up circuit 22 is zero from output voltage equal to zero to output voltage equal to $V_1$; the impedance of pull-up circuit 22 varies from output voltage equal to $V_1$ to output voltage equal to $V_2$; the impedance of pull-up circuit 22 varies from output voltage equal to $V_2$ to output voltage equal to $V_{DD1}$, and; the impedance of pull-up circuit 22 varies for output voltages greater than $V_{DD1}$. If driver 16 could be designed so that the impedance of driver 16 matches the impedance of the conductive line of data bus 14 coupled thereto, driver 16 would not be a source of signal ringing. However, the impedance of pull-up circuit 22 will mismatch the impedance of data bus 14. As such, the impedance of driver 16 will mismatch the impedance of data bus 14 for certain output voltages.

FIG. 3A is a schematic diagram of driver 16 with P channel FETS 34–36 and N channel FETs 44–48 added thereto. IO driver 16 shown in FIG. 3A should not be considered prior art under 35 USC Section 102 to the invention described or claimed within this specification. Pull-up circuit 22 of FIG. 3A now includes two branches designated normal connected branch 52 and diode connected branch 54 through which output node 28 may be charged when $D_{in}$ equals ground. The normal connective branch includes P channel FETs 30 and 32 connected in series between $V_{DD1}$ and output node 28, while the diode connected branch 54 includes P channel FETs 34–38 connected in series between $V_{DD1}$ and output node 28. P channel FET 38 is configured as a diode.

The pull-up circuit 22 shown in FIG. 3A, unlike the pull-up circuit 22 shown in FIG. 2A, has a non-zero impedance at its output for a certain range of output voltages. FIG.

3B illustrates IV plots for the normal connected branch 52 and the diode connected branch 54. The plot for the diode connected branch 54 shows that the impedance of the diode connected branch 54 is constant for output voltages between zero and $V_1$; the impedance of the diode connected branch 54 varies between output voltages $V_1$ and $V_2$; and the impedance of the diode connected branch 54 is zero for output voltages greater than $V_2$. FIG. 3B also illustrates the IV plot for the pull-up circuit 22 in FIG. 3A. The IV plot for pull-up circuit 22 is the addition of the IV plots for the normal connected branch 52 and the diode connected branch 54. In FIG. 3B, the pull-up circuit IV plot is linear between ground and $V_2$. As such, the impedance for pull-up circuit 22 is a non-zero constant between output voltages equal to ground and $V_2$. However, due to the influence of the normal connected branch, the IV plot is nonlinear for output voltages which exceed $V_2$. In other words, the impedance of the pull-up circuit 22 shown in FIG. 3B varies for output voltages which exceed $V_2$. As such, the impedance of driver 16 shown in FIG. 3A will mismatch the impedance of data bus 14 at least for output voltages that exceed $V_2$.

SUMMARY OF THE INVENTION

Disclosed is an input/output (IO) device having a power supply node, an input node for receiving an input data signal, and an output node for outputting an output data signal generated in response to the input node receiving the input data bit signal. The IO device also includes a pull-up driver coupled to the power supply node and the output node, wherein the pull-up driver comprises an impedance at the output node which is constant for all voltages at the output node. Additionally, the IO device may have a circuit coupled to the input node, the pull-up driver, and the output node. This circuit is configured to generate a signal that is provided to the pull-up driver. The signal generated by the circuit varies as a function of the voltage at the output node.

In one embodiment, the pull-up driver includes first and second p-channel field effect transistors (FETs). The drain of the first p-channel FET is coupled to the source of the second p-channel FET, the source of first p-channel FET is coupled to the power supply node, the drain of the second p-channel FET is coupled to the output node, the gate of the first p-channel FET is coupled to receive the signal generated by the circuit, and the gate of the second p-channel FET is coupled to a p-channel bias voltage node.

In one embodiment, the circuit includes first, second and third n-channel FETs and a p-channel FET. The source and drain of the first and second n-channel FETs are coupled together, the sources of the second n-channel FET and the p-channel FET are coupled together, the drains of the p-channel FET and the third n-channel FET are coupled together and to the pull-up driver, the source of the third n-channel FET is coupled to the input node, the gates of the first and third n-channel FETs are coupled to an n-channel bias voltage node, the gate of the second n-channel device is coupled to the output node, and the gate of the p-channel FET is coupled to a p-channel bias voltage node.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

Figure 1:
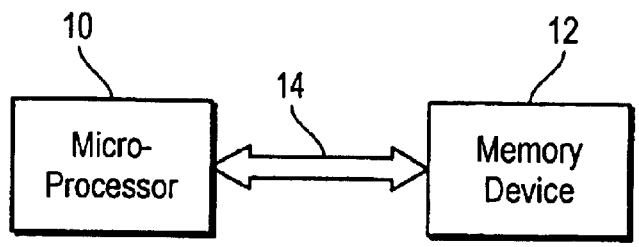
FIG. 1 is a block diagram of microprocessor coupled to memory device.
Figure 2A:
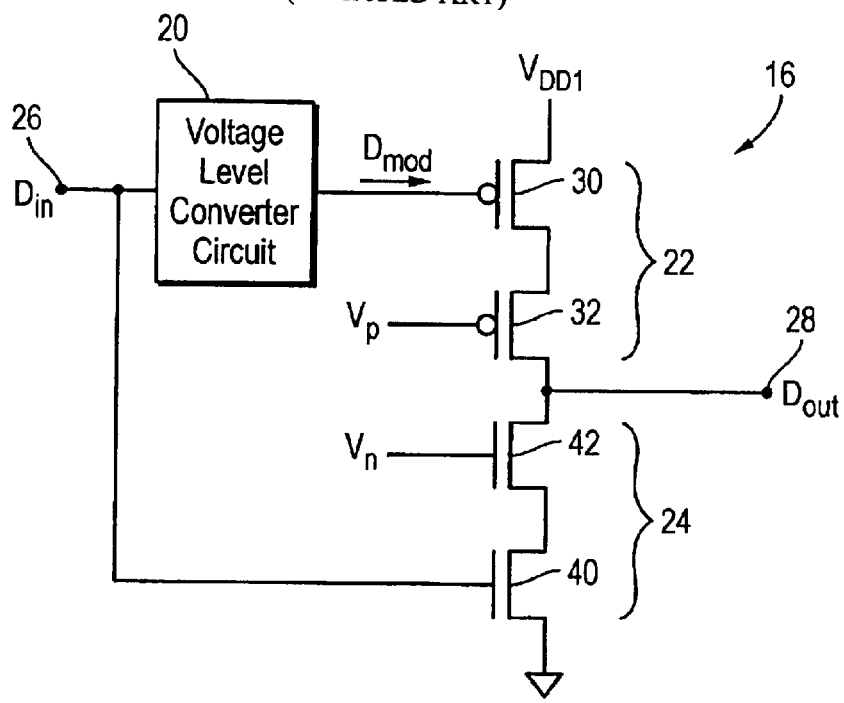
FIG. 2A is a schematic diagram of a driver which may be employed in one of the IO devices of the microprocessor shown in FIG. 1.
Figure 2B:
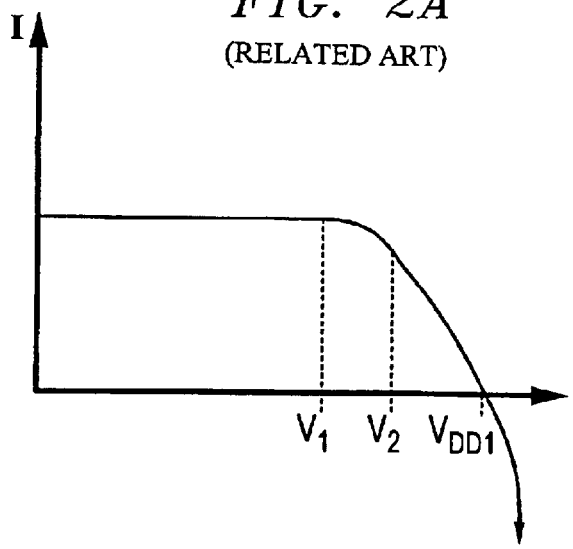
FIG. 2B is current/voltage (IV) plot of the pull-up circuit shown in FIG. 2A.

While the invention is susceptible to various modifications and alternative forms, specific embodiments thereof are shown by way of example in the drawings and will herein be described in detail. However, the drawings and detailed description thereto are not intended to limit the invention to the particular form disclosed. On the contrary, the intention is to cover all modifications, equivalents, and alternatives falling within the spirit and scope of the present invention as defined by the appended claims.

DETAILED DESCRIPTION

As noted in the background section above, devices such as microprocessors communicate with other devices such as memory devices via a serial or parallel data bus. The present invention will be described with reference to a microprocessor coupled to a memory device via a parallel data bus, it being understood that the present invention should not be limited thereto. The term device includes circuits consisting of transistors and/or other discrete elements coupled together and configured to perform a function. The term device is meant to include microprocessors, memories, etc. As used herein, devices can be coupled together either directly, i.e., without an intervening device, or indirectly, with one or more intervening devices. As used herein, the term connected devices means two or more devices connected directly together without any intervening circuit via one or more conductors. The term coupled includes the term connected within its meaning.

Figure 4:
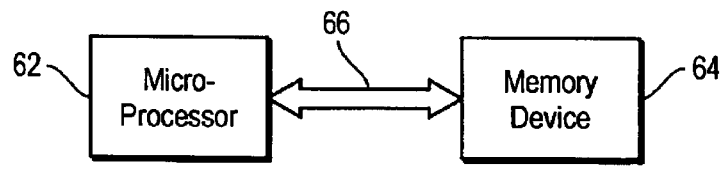
FIG. 4 is a block diagram of microprocessor coupled to memory device.

FIG. 4 is a block diagram of a microprocessor 52 coupled to memory device 64 via parallel data bus 66. In FIG. 4 microprocessor 52 is coupled directly to memory device 64 via data bus 66. Although not shown, data bus 66 includes a plurality of conductive lines coupled between microprocessor 62 and memory device 64. Microprocessor 64 includes a plurality of IO devices (not shown in FIG. 4) coupled to respective conductive lines of data bus 66.

Figure 5:
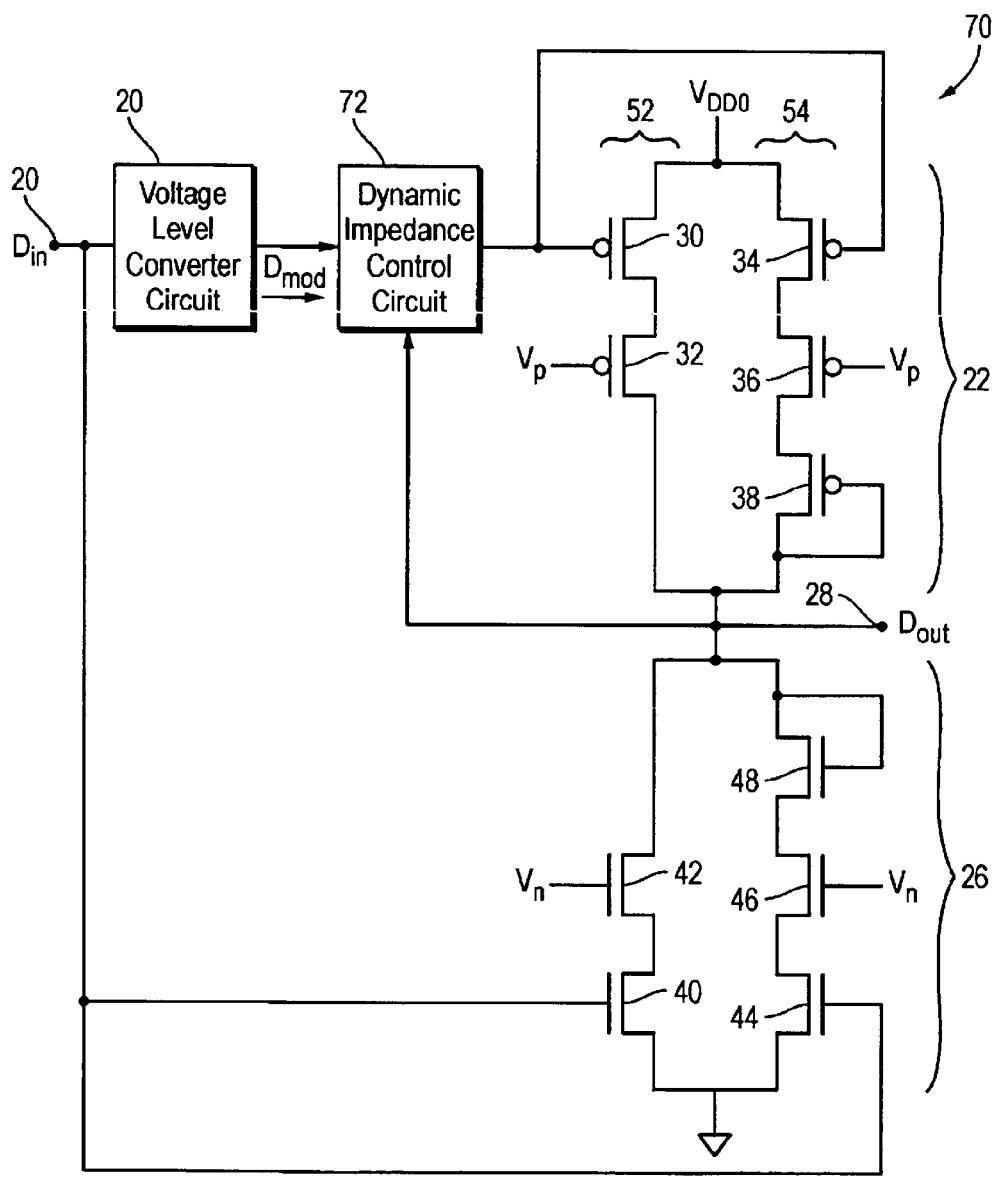
FIG. 5 is a schematic diagram of a driver which may be employed in one of the IO devices of the microprocessor shown in FIG. 4.

FIG. 5 illustrates a driver 70 which may be employed within one or more of the IO devices of microprocessor 62. Essentially, driver 70 is the driver 16 shown in FIG. 3A with a dynamic impedance control circuit 72 added thereto. Dynamic impedance control circuit 72 includes a pair of inputs coupled to the output of voltage level converter circuit 20 and to output node 28, respectively. Dynamic impedance control circuit 72 generates a control signal which is subsequently provided to the gates of P-channel FETs 30 and 34. The control signal prevents the normal branch 52, and thus pull-up circuit 22, from operating in the mode where its impedance would otherwise vary. More particularly, if the voltage at output node 28 increases beyond $V_2$, control circuit 72 operates to decrease the impedance of branch 52 to offset the increase in impedance of branch 52 that would otherwise occur if the gate of P-channel FET 30 was connected directly to the output of voltage level converter circuit 20.

The gate of P-channel FET 34 need not be connected to control circuit 72. In an alternative embodiment, the gate of P-channel FET 34 may be connected to the output of voltage level control circuit 20 rather than the output of dynamic impedance control circuit 72. However, for purposes of explanation, the present invention will be described with the gates of P-channel FETs 30 and 34 connected to the output of dynamic impedance control circuit 72 as shown in FIG. 5.

In one embodiment, control circuit 72 generates the control signal provided to the gates of P-channel FETs 30 and 34 as a function of the voltage at output node 28 and/or the signal generated by voltage level control circuit 20. The signal generated by voltage level control circuit 20 varies as a function of data input signal $D_{in}$ received at input node 26. Accordingly, the dynamic impedance control circuit 72 generates the control signal as a function of the voltage at output node 28 and/or the data input signal $D_{in}$.

Figure 6:
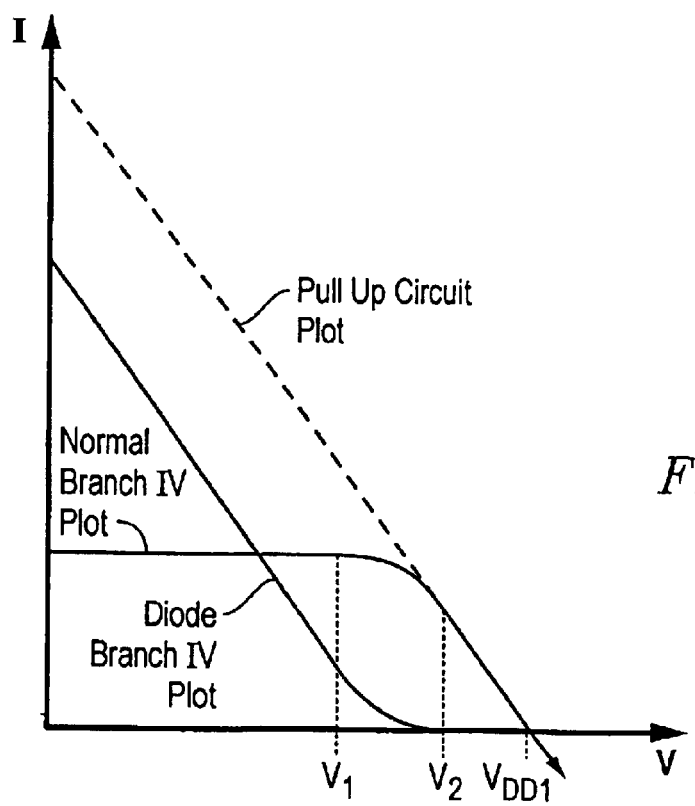
FIG. 6 is current/voltage (IV) plot of the pull-up circuit shown in FIG. 5.

As noted above, control circuit 72 controls normal connected branch 52 so that normal connected branch 52, and thus pull-up circuit 22, does not operate in the mode where its impedance would otherwise vary. FIG. 6 illustrates IV plots for the normal connected and diode connected branches 52 and 54, respectively, shown in FIG. 5 with normal connected branch 52 operating under control of circuit 72. FIG. 6 also shows the IV plot of the pull-up circuit 22 of FIG. 5. The IV plot of pull-up circuit 22 is the combination of IV plots for the normal and diode connected branches 52 and 54, respectively.

Figure 3A:
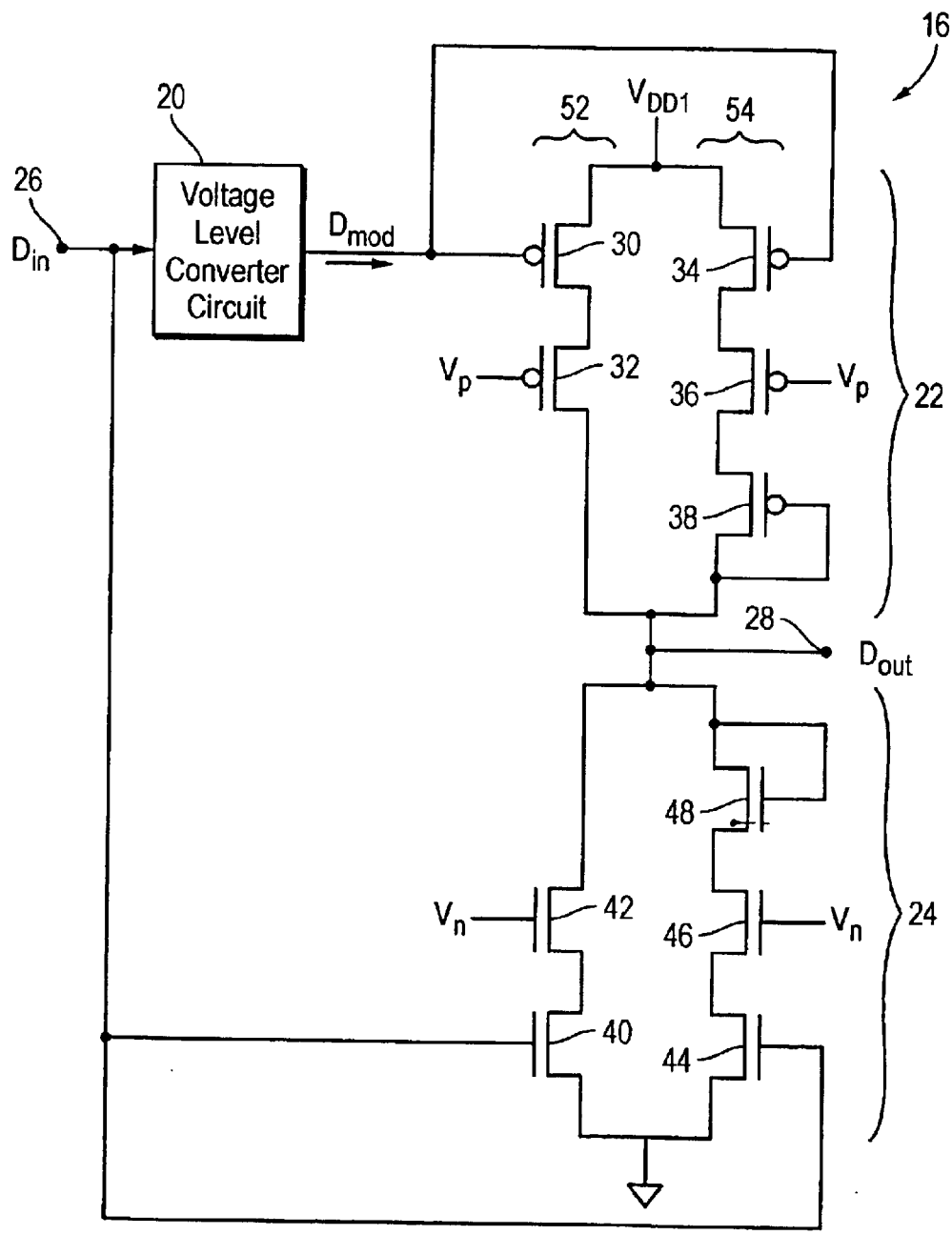
FIG. 3A is a schematic diagram of another driver which may be employed in one of the IO devices of the microprocessor shown in FIG. 1.
Figure 3B:
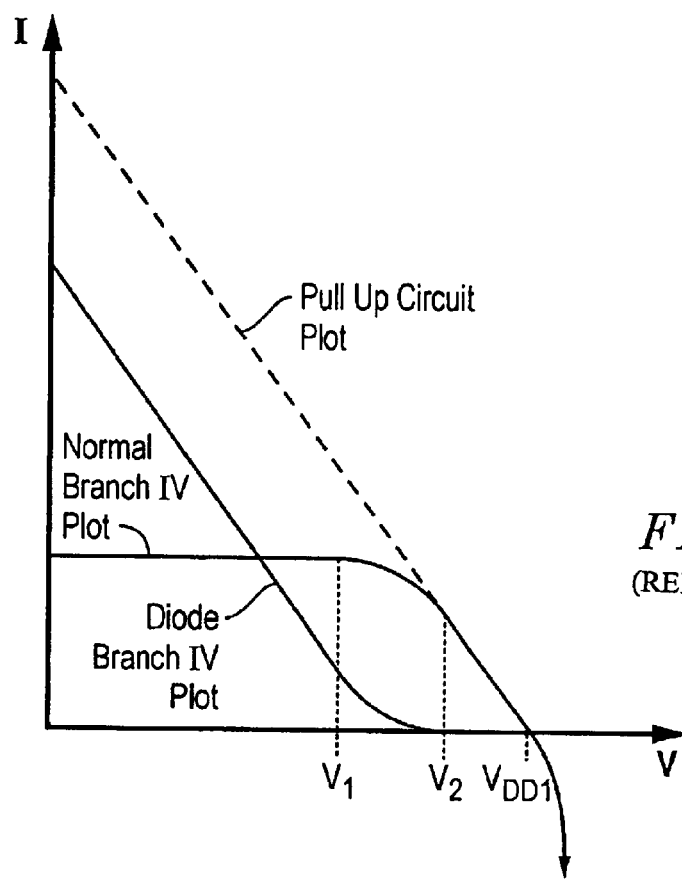
FIG. 3B is current/voltage (IV) plot of the pull-up circuit shown in FIG. 3A.

The IV plots shown in FIG. 6 are substantially similar to those shown in FIG. 3B. However, unlike FIG. 3B, the impedance of normal connected branch 52, operating under control of control circuit 72, is constant even though the voltage at output node 28 exceeds $V_2$. In contrast the impedance of branch 52 in FIG. 3B increases as the output voltage increases beyond $V_2$. Because control circuit 72 maintains the impedance of branch 52, FETs 30–38 can be designed so that the impedance of pull-up circuit 22 is constant for the entire output voltage range at node 28. FETs 30–38 can be designed so that the non-constant impedance of the diode branch 54 is aligned with the non-constant impedance of the normal branch 52 so that when the impedance of the two branches, when combined, is constant for the output voltage range $V_1$–$V_2$. Accordingly, FETs 30–38 can be designed so that the impedance of driver 70 is constant and matches the impedance of the conductive line of data bus 66 coupled to node 28.

Control circuit 72 is in a feed back path between output node 28 and the gate of FET 32. When $D_{in}$ switches from $V_{DD2}$ to ground, as described in the background section, voltage level converter circuit 20 generates $D_{mod}$ equal to $V_{int}$. Control circuit 72 passes $D_{mod}$ to the gate of FET 30 with little or no modification to $D_{mod}$ even when the voltage at output node 28 is low (e.g., ground). Thus, when the voltage at output node 28 is ground when $D_{in}$ switches from $V_{DD2}$ to ground, control circuit passes $D_{mod}$ equal to $V_{int}$ with little or no modification. With the voltage of gate FET 30 at $V_{int}$, FET 30 is fully switched on and branch 52 conducts current for charging output node 28. Again, FETs 40 and 44 are switched off thus isolating node 28 from ground.

As the output voltage on node 28 rises toward $V_{DD1}$ or beyond, control circuit 72 decreases the voltage magnitude of $D_{mod}$ even though $D_{in}$ is maintained at ground. The decrease in magnitude of $D_{mod}$ maintains the impedance of branch 52 at a constant or substantially constant value. Without the decrease in $D_{mod}$ magnitude, the impedance of branch 52 would decrease substantially as the output voltage increases beyond $V_{DD1}$. The effect produced by control circuit can be seen when comparing FIGS. 3B and 6. For output voltages greater than $V_{DD1}$, the impedance of pull-up circuit 22 in FIG. 5 is held constant while the impedance of pull-up circuit 22 in FIG. 3A varies.

Figure 7:
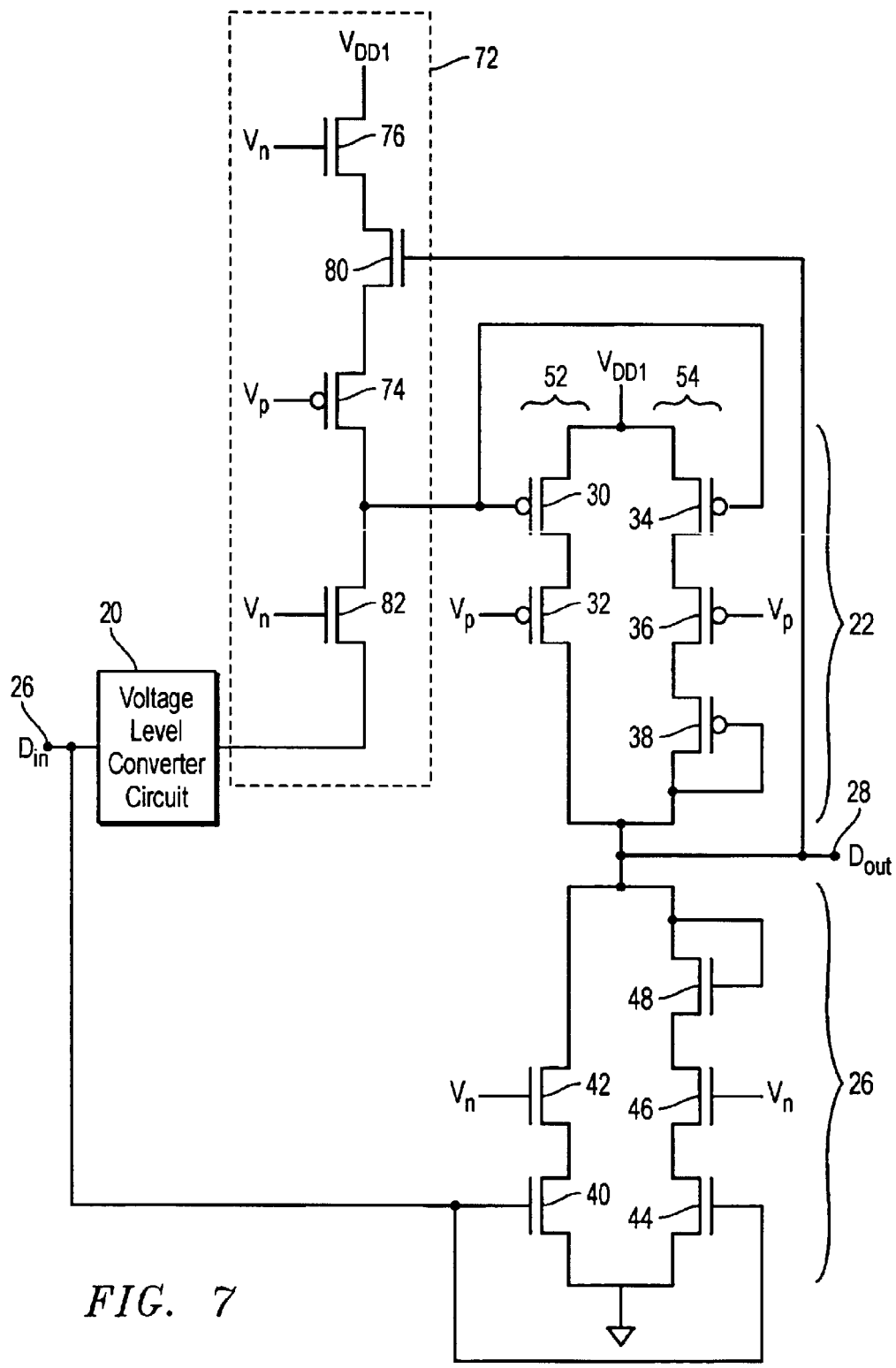
FIG. 7 illustrates one embodiment of the control circuit employed in the driver of FIG. 5.

FIG. 7 illustrates one embodiment of dynamic impedance control circuit 72. In FIG. 7, control circuit 72 includes P-channel FET 74 and N-channel FETs 76–82. The gate of N-channel FET 80 is coupled to output node 28 while the source of N-channel FET 82 is coupled to the output of the voltage level converter circuit 20 (not shown in FIG. 7). The gates of P-channel FETs 30 and 34 are coupled to the drains of P-channel FET 74 and N-channel FET 82.

In an alternative embodiment, voltage level converter circuit 20 of FIG. 3A can be altered so that $D_{mod}$, the signal it generates varies between $V_{DD2}$ and $V_{int2}$, where $V_{int2}$ has a predetermined magnitude that maintains operation of the normal branch 52 within the range where its impedance is constant. In this embodiment, no feed back path exists between the voltage level converter circuit 20 and output node 28.

Although the present invention has been described in connection with several embodiments, the invention is not intended to be limited to the specific forms set forth herein. On the contrary, it is intended to cover such alternatives, modifications, and equivalents as can be reasonably included within the spirit and scope of the invention as defined by the appended claims.

What is claimed is:

1. An input/output IO device comprising:

a power supply node;

an input node for receiving an input data signal;

an output node for outputting an output data signal generated in response to the input node receiving the input data bit signal;

a pull-up driver coupled to the power supply node and the output node;

a circuit coupled to the input node, the pull-up driver, and the output node, wherein the circuit is configured to generate a signal that is provided to the pull-up driver, wherein the signal to the pull-up driver varies as a function of the voltage at the output node and the voltage of the input data signal; and wherein the pull-up driver comprises first and second n-channel field effect transistors (FETs), wherein the drain of the first p-channel FET is coupled to the source of the second p-channel FET, the source of first p-channel FET is coupled to the power supply node, the drain of the second p-channel FET is coupled to the output node, the gate of the first p-channel FET is coupled to receive the signal generated by the circuit, and the gate of the second p-channel FET is coupled to a p-channel bias voltage node.

2. The I/O device of claim 1 wherein the pull-up driver comprises third, fourth and fifth p-channel FETs, wherein the drain of the third p-channel FET is coupled to the source of the fourth p-channel FET, the drain of the fourth p-channel FET is coupled to the source of the fifth p-channel FET, the gate of the third p-channel FET is coupled to receive the signal generated by the circuit, the gate of the fourth p-channel FET is coupled to the p-channel bias voltage node, and the gate and drain of the fourth p-channel FET are coupled together and to the output node.

3. The I/O device of claim 1 wherein the pull-up driver comprises third and fourth p-channel FETs, wherein the source of the third p-channel PET is coupled to the drain of the first p-channel FET, the drain of the third p-channel FET is coupled to the source of the fourth p-channel FET, the gate of the third p-channel FET is coupled to the p-channel bias voltage node, and the gate and drain of the forth p-channel FET are coupled together and to the output node.

4. The I/O device of claim 1 wherein the pull-up driver defines an impedance at the output node thereof, wherein the impedance is constant for all voltages at the output node.

5. An input/output (IO) device comprising:
a power supply node;
an input node for receiving an input data signal;
an output node for outputting an output data signal generated in response to the input node receiving the input data bit signal;
a pull-up driver coupled to the power supply node and the output node;
a circuit coupled to the input node, the pull-up driver, and the output node, wherein the circuit is configured to generate a signal that is provided to the pull-up driver, wherein the signal to the pull-up driver varies as a function of the voltage at the output node and the voltage of the input data signal; and
wherein the circuit comprises first, second, and third p-channel FETs and a p-channel FET, wherein the source and drain of the first and second n-channel FETs are coupled together, the sources of the second n-channel FET and the p-channel FET are coupled together, the drains of the p-channel FET and the third n-channel FET are coupled together and to the pull-up driver, the source of the third n-channel FET is coupled to the input node, the gates of the first and third n-channel FETs are coupled to an n-channel bias voltage node, the gate of the second n-channel device is coupled to the output node, and the gate of the p-channel FET is coupled to a p-channel bias voltage node.

6. The I/O device of claim 5 wherein the pull-up driver comprises first and second p-channel field effect transistors (FETs), wherein the drain of the first p-channel FET is coupled to the source of the second p-channel FET, the source of the first p-channel FET is coupled to the power supply node, the drain of the second p-channel FET is coupled to the output node, the gate of the first p-channel FET is coupled to the drain of the p-channel FET, and the gate of the second p-channel FET is coupled to the p-channel bias voltage node.

7. The I/O device of claim 6 wherein the pull-up driver comprises third, fourth and fifth p-channel FETs, wherein the drain of the third p-channel FET is coupled to the source of the fourth p-channel FET, the drain of the fourth p-channel FET is coupled to the source of the fifth p-channel FET, the gate if the third p-channel FET is coupled to the drain of the p-channel FET, the gate of the fourth p-channel FET is coupled to the p-channel bias voltage node, and the gate and drain of the fifth p-channel FET are coupled together and to the output node.

8. The I/O device of claim 6 wherein the pull-up driver comprises third and fourth p-channel FETs, wherein the source of the third p-channel FET is coupled to the drain of the first p-channel FET, the drain of the third p-channel FET is coupled to the source of the fourth p-channel FET, the gate of the third p-channel FET is coupled to the p-channel bias voltage node, and the gate and drain of the forth p-channel FET are coupled together and to the output node.

9. An apparatus comprising:
a microprocessor;
a memory device;
a data bus coupled between the microprocessor and the memory device;
wherein the processor comprises and IO device, the IO device comprising:
a power supply node;
an input node for receiving an input data signal;
an output node for outputting an output data signal generated in response to the input node receiving the input data bit signal;
a pull-up driver coupled to the power supply node and the output node;
a circuit coupled to the input node, the pull-up driver, and the output node, wherein the circuit is configured to generate a signal that is provided to the pull-up driver,
wherein the signal provided to the pull-up driver varies as a function of the voltage at the output node and the voltage of the input data signal; and
wherein the pull-un driver comprises first and second p-channel field effect transistors (FETs), wherein the drain of the first p-channel FET is coupled to the source of the second p-channel FET, the source of the first p-channel FET is coupled to the power supply node, the drain of the second p-channel FET is coupled to the output node, the gate of the first p-channel FET is coupled to receive the signal generated by the circuit, and the gate of the second p-channel FET is coupled to a p-channel bias voltage node.

10. The apparatus of claim 9 wherein the pull-up driver comprises third, fourth and fifth p-channel FETs, wherein the drain of the third p-channel FET is coupled to the source of the fourth p-channel FET, the drain the fourth p-channel FET is coupled to the source of the fifth p-channel FET, the gate of the third p-channel FET is coupled to receive the signal generated by the circuit, the gate of the fourth p-channel FET is coupled to the p-channel bias voltage node, and the gate and drain of the fifth p-channel FET are coupled together and to the output node.

11. An apparatus comprising:
a microprocessor;
a memory device;
a data bus coupled between the microprocessor and the memory device;
wherein the processor comprises and IO device, the IO device comprising:
a power supply node;
an input node for receiving an input data signal;
an output node for outputting an output data signal generated in response to the input node receiving the input data signal;
a pull-up driver coupled to the power supply node and the output node;
a circuit coupled to the input node, the pull-up driver, and the output node, wherein the circuit is configured to generate a signal that is provided to the pull-up driver, wherein the signal provided to the pull-up driver varies as a function of the voltage at the output node; and wherein the circuit comprises first, second, and third n-channel FETs and a p-channel FET, wherein the source and drain of the first and second n-channel FETs are coupled together, the sources of the second n-channel FET and the p-channel FET are coupled together, the drains of the p-channel FET and the third n-channel FET are coupled together and to the pull-up driver, the source of the third n-channel FET is coupled to the input node, the gates of the first and third n-channel FETs are coupled to an n-channel bias voltage node, the gate of the second n-channel device is couple do the output node, and the gate of the p-channel FET is coupled to a p-channel bias voltage node.

12. The apparatus of claim 9 wherein the pull-up driver defines an impedance at the output node thereof, wherein the impedance is constant over all voltages at the output node thereof, and wherein the impedance equals an impedance of the data bus coupled thereto.

13. An input/out (IO) device comprising:

a power supply node;

an input for receiving an input data signal;

an output for outputting an output data signal generated in response to the input node receiving the input data bit signal;

a pull-up driver including an input to receive a signal that varies as a function of the voltage at the output node and the voltage of the input data signal, the pull-up driver coupled to the power supply node and the output node;

wherein the pull-up driver comprises an impedance at the output node which is constant for all voltages at the output node.

14. The IO device of claim 13 further comprising a circuit coupled to the input node, the pull-up driver, and the output node, wherein the circuit is configured to generate a signal that is provided to the pull-up driver, wherein the signal provided to the pull-up driver varies as a function of the voltage at the output node.

15. The IO device of claim 13 wherein the circuit generates the signal as a function of the voltage of the input data signal.

* * * * *